US010477734B2

(12) United States Patent
Oouchi

(10) Patent No.: US 10,477,734 B2
(45) Date of Patent: Nov. 12, 2019

(54) ELECTRONIC DEVICE

(71) Applicant: FANUC CORPORATION, Yamanashi (JP)

(72) Inventor: Junichi Oouchi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/148,168

(22) Filed: Oct. 1, 2018

(65) Prior Publication Data
US 2019/0110381 A1    Apr. 11, 2019

(30) Foreign Application Priority Data
Oct. 5, 2017    (JP) ................................. 2017-194766

(51) Int. Cl.
*H05K 7/20*    (2006.01)
*G02F 1/1333*   (2006.01)

(52) U.S. Cl.
CPC ... *H05K 7/20963* (2013.01); *G02F 1/133385* (2013.01); *H05K 7/2039* (2013.01); *F28F 2215/04* (2013.01)

(58) Field of Classification Search
CPC ......... H05K 7/20963–20972; G02F 1/133385; F28F 2115/04
See application file for complete search history.

(56) References Cited

U.S. PATENT DOCUMENTS

| | | | | |
|---|---|---|---|---|
| 6,714,410 B2* | 3/2004 | Wellhofer | ......... | G02F 1/133385 297/67 |
| 7,556,087 B2* | 7/2009 | Hung | .................... | H01L 23/467 165/122 |
| 7,753,106 B2* | 7/2010 | Lin | ...................... | H01L 23/3672 165/185 |
| 7,782,618 B2* | 8/2010 | Hata | .................... | H05K 5/0213 165/185 |
| 8,264,659 B2* | 9/2012 | Mikubo | ............ | G02F 1/133385 349/161 |
| 9,049,804 B2* | 6/2015 | Lang | ................... | H05K 7/20963 |
| 9,510,488 B2* | 11/2016 | Okuaki | ............... | H05K 7/20863 |
| 2006/0243948 A1* | 11/2006 | Ishiwa | ................. | G02B 6/0085 252/299.61 |

(Continued)

FOREIGN PATENT DOCUMENTS

| | | |
|---|---|---|
| JP | 2006-136984 A | 6/2006 |
| JP | 2012-043952 A | 3/2012 |

(Continued)

*Primary Examiner* — Robert J Hoffberg
(74) *Attorney, Agent, or Firm* — Robert P. Michal, Esq.; Carter, DeLuca & Farrell LLP

(57) ABSTRACT

In an electronic device having a heat sink, the heat sink includes a flat-plate-shaped base and fins protruding from one surface of the base and extending substantially in the direction of gravity in a state where the electronic device is mounted on an apparatus. Each of the fins has a first inclined portion on a lower surface thereof in the direction of gravity, and the first inclined portion is inclined downward in the direction of gravity toward the base. The base has a second inclined portion on a lower surface thereof in the direction of gravity, and the second inclined portion is inclined with respect to the horizontal direction when the base is viewed from a side where the fins are provided.

5 Claims, 5 Drawing Sheets

(56) References Cited

U.S. PATENT DOCUMENTS

| | | | |
|---|---|---|---|
| 2008/0144279 A1* | 6/2008 | Yamamoto | H05K 7/20918 361/694 |
| 2012/0236499 A1* | 9/2012 | Murayama | H04N 5/64 361/696 |
| 2014/0063759 A1 | 3/2014 | Honda | |
| 2014/0085820 A1 | 3/2014 | Yamamoto et al. | |
| 2015/0362262 A1* | 12/2015 | Sekikawa | F28F 17/005 165/185 |
| 2015/0373869 A1* | 12/2015 | Macerini | H05K 5/0213 361/704 |
| 2016/0150683 A1* | 5/2016 | Sagerian | H04N 5/64 361/714 |
| 2017/0334375 A1* | 11/2017 | Shigyo | H01R 13/518 |
| 2019/0130520 A1* | 5/2019 | Yoshida | G06T 1/20 |
| 2019/0130521 A1* | 5/2019 | Koizumi | G06T 1/20 |
| 2019/0132953 A1* | 5/2019 | Yoshida | H05K 1/141 |
| 2019/0132964 A1* | 5/2019 | Kobayashi | H05K 5/0017 |
| 2019/0132979 A1* | 5/2019 | Yoshida | H05K 5/0286 |
| 2019/0132998 A1* | 5/2019 | Yoshida | H05K 7/20963 |
| 2019/0133001 A1* | 5/2019 | Koizumi | H05K 7/20972 |

FOREIGN PATENT DOCUMENTS

| | | |
|---|---|---|
| JP | 2014-046432 A | 3/2014 |
| JP | 2014-072211 A | 4/2014 |
| JP | 2015-034865 A | 2/2015 |

\* cited by examiner

ELECTRONIC DEVICE

CROSS-REFERENCE TO RELATED APPLICATION

This application is based upon and claims the benefit of priority from Japanese Patent Application No. 2017-194766 filed on Oct. 5, 2017, the contents of which are incorporated herein by reference.

BACKGROUND OF THE INVENTION

Field of the Invention

The present invention relates to an electronic device having a heat sink.

Description of the Related Art

Japanese Laid-Open Patent Publication No. 2015-034865 discloses a liquid crystal display unit provided with heat radiation fins on a rear side thereof.

SUMMARY OF THE INVENTION

When the liquid crystal display unit described in Japanese Laid-Open Patent Publication No. 2015-034865 is mounted in a machine tool or the like, liquid such as cutting fluid may adhere to the heat radiation fins. In a case where there are electronic components and others under the heat radiation fins, the liquid attached to the heat radiation fins drops on the electronic components etc., thereby causing the electronic components and the like to malfunction disadvantageously.

The present invention has been devised to solve the above-described problem, it is therefore an object of the present invention to provide an electronic device capable of dropping liquid attached to fins to a specific location.

An aspect of the present invention resides in an electronic device having a heat sink, in which: the heat sink includes a flat-plate-shaped base and fins protruding from one surface of the base and extending substantially in a direction of gravity in a state where the electronic device is mounted on an apparatus; each of the fins has a first inclined portion on a lower surface thereof in the direction of gravity, the first inclined portion being configured to incline downward in the direction of gravity toward the base; and the base has a second inclined portion on a lower surface thereof in the direction of gravity, the second inclined portion being configured to incline with respect to the horizontal direction when the base is viewed from a side where the fins are provided.

According to the present invention, it is possible to drop the liquid attaching to the fins on a specific location.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

First Embodiment

[Configuration of Display Unit]

Figure 1:
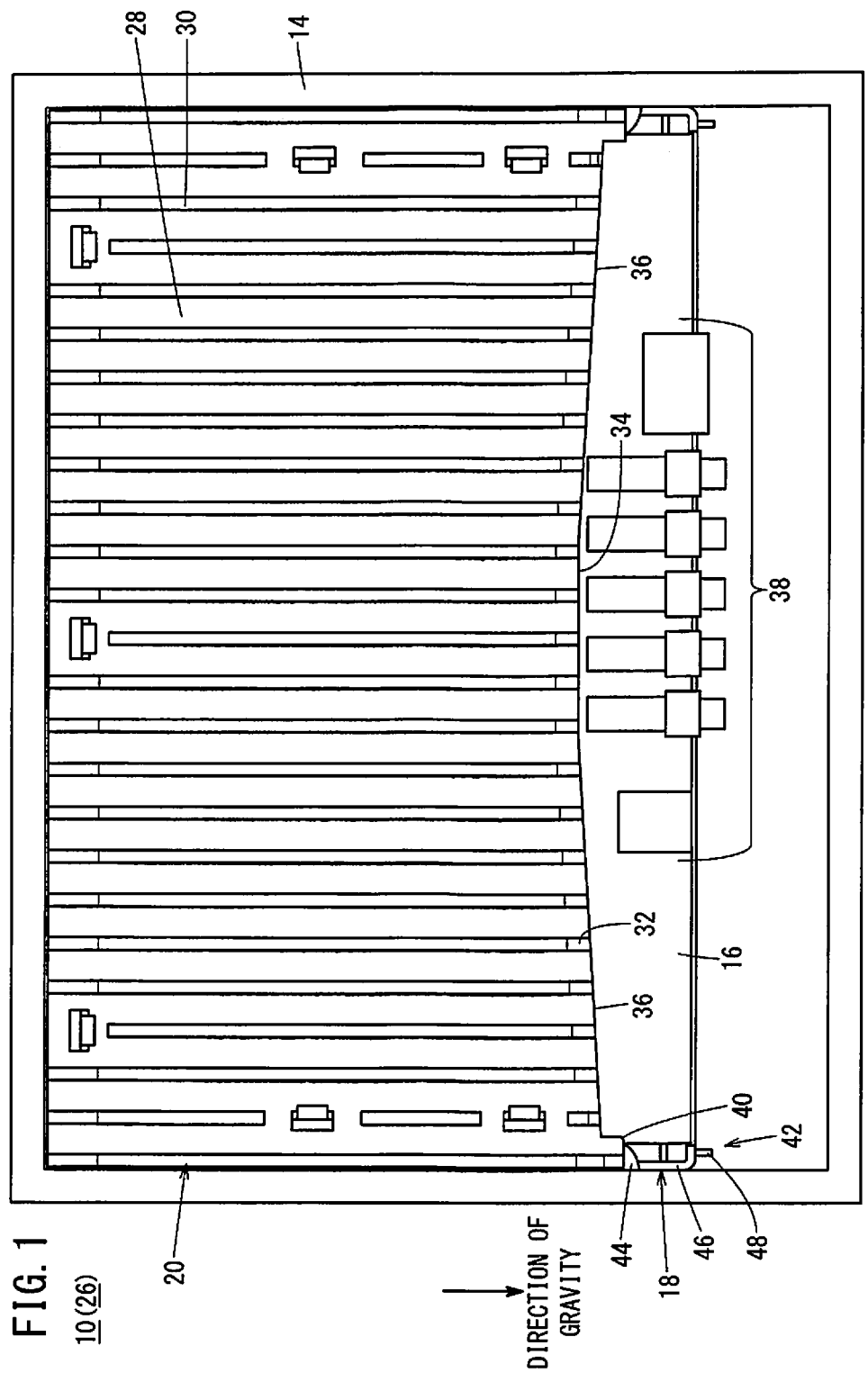
FIG. 1 is a schematic rear view showing a display unit.
Figure 2:
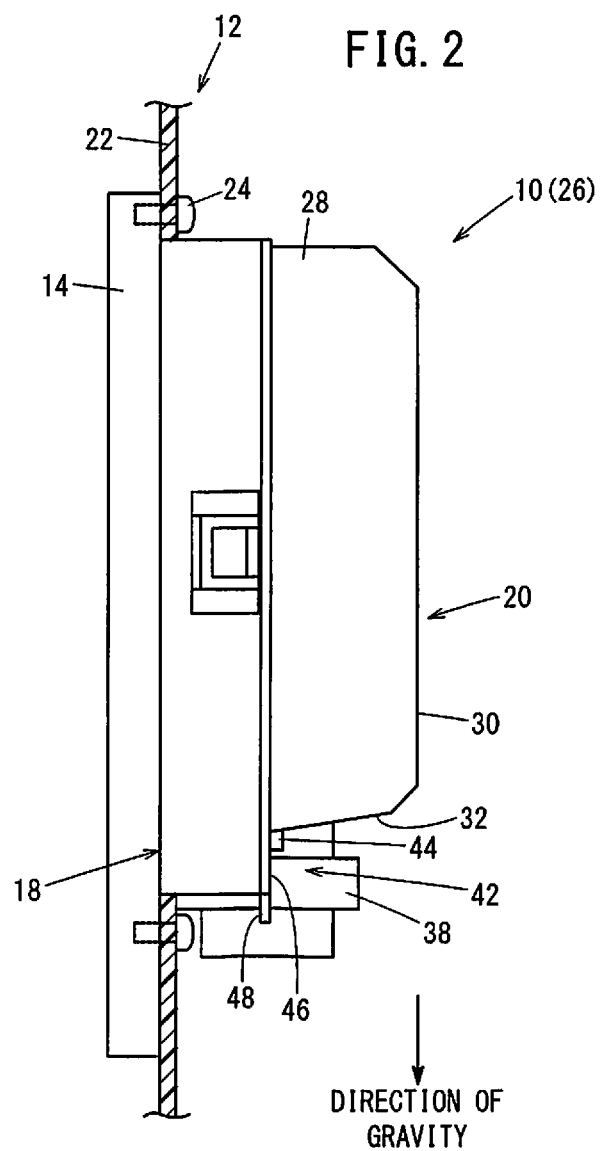
FIG. 2 is a schematic side view showing a display unit.

FIG. 1 is a schematic rear view of a display unit 10. FIG. 2 is a schematic side view of the display unit 10. FIG. 2 shows a state in which the display unit 10 is attached to an apparatus (device, machine, etc.) 12. In the state where the display unit 10 is attached to the apparatus 12 such as a machine tool, the lower side of FIGS. 1 and 2 indicates the lower side in the direction of gravity.

The display unit 10 includes a touch panel display 14, an electronic board 16, a housing 18, and a heat sink 20. The touch panel display 14 includes a liquid crystal display panel serving as a display screen of the touch panel display 14, and a transparent sheet-shaped touch panel applied to the liquid crystal panel. The touch panel display 14 has, on a rear surface thereof, the electronic board 16 with electronic components and the like being mounted thereon in order to control the touch panel display 14. The heat sink 20 for cooling the electronic components and the like on the electronic board 16 is arranged on a rear surface of the electronic board 16.

The housing 18 is formed of resin or the like by injection molding. The housing 18 is fixed to the rear surface of the touch panel display 14 in a state of holding the electronic board 16 and the heat sink 20. It is noted that the cooling unit of the display unit 10 of the present embodiment is of a fanless type, and that the size of the heat sink 20 of the present embodiment is larger than that of the heat sink of a cooling unit having a fan.

The display unit 10 is fixed to an exterior cover 22 of the apparatus 12 with screws 24. In the state where the display unit 10 is attached to the apparatus 12, the rear surface side of the display unit 10 is housed in the exterior cover 22. It should be noted that the display unit 10 constitutes an electronic device 26.

[Structure of Heat Sink]

Figure 3:
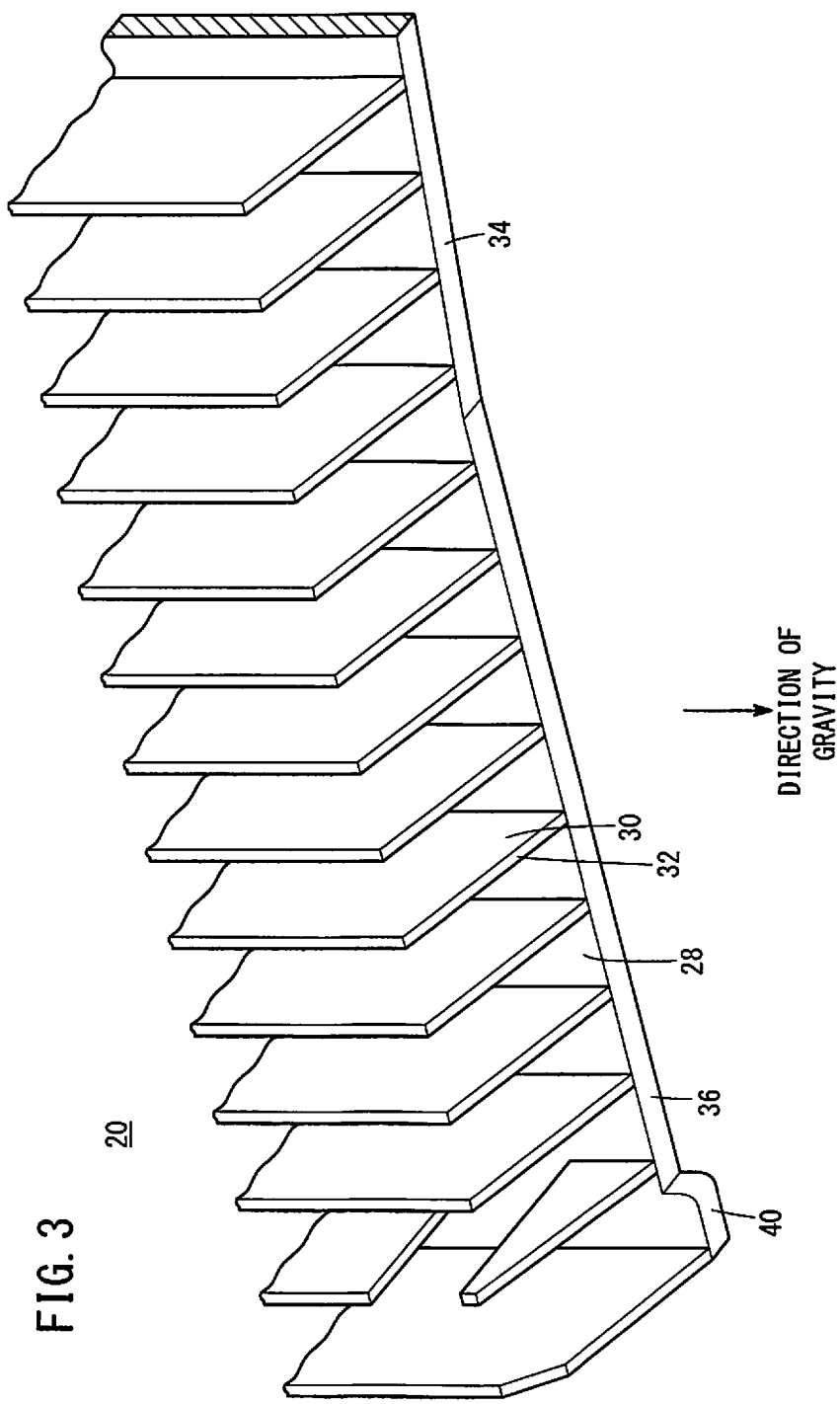
FIG. 3 is a partial perspective view showing a heat sink.

FIG. 3 is a partial perspective view of the heat sink 20. The structure of the heat sink 20 will be described with reference to FIGS. 1 to 3.

The heat sink 20 is formed by extrusion molding and cutting (machining) using a material having good heat transfer characteristics such as aluminum. The heat sink 20 is composed of a base 28 and fins 30. The base 28 is a flat plate member, and one side surface of the base 28 on the electronic board 16 side is positioned close to high-heat-generating electronic components on the electronic board 16. A surface of the base 28 on the opposite side of a surface thereof facing the electronic board 16 is formed with fins 30 projected from the surface. Each fin 30 is formed into a plate shape extending substantially in the direction gravity, and a number of fins 30 are arrayed substantially in parallel, side by side, in the horizontal direction. Here, the fins 30 may be formed so as to extend at an angle with respect to the direction of gravity.

Each fin 30 has, on a lower side thereof in the direction of gravity, a first inclined portion 32 which is inclined downward toward the base 28. The proximal part of a lower surface of the fin 30 in the direction of gravity is formed so that the lower surface of the fin 30 is flush with a lower surface of the base 28 in the direction of gravity.

The lower surface of the base 28 is made up of a horizontal surface portion 34 extending in the horizontal direction, and second inclined portions 36 that are inclined downward with respect to the horizontal direction toward the outer sides of the base 28 when the base 28 is viewed from a side where the fins 30 are provided. That is, the second inclined portions 36 are formed on respective both sides of the horizontal surface portion 34 when the base 28 is viewed from the side where the fins 30 are provided. It should be noted that the configuration of the lower surface of the base 28 may be changed as appropriate as long as it has the second inclined portions 36 inclined relative to the horizontal direction when the base 28 is viewed from the side where the fins 30 are provided.

On a lower side of the heat sink 20 in the direction of gravity, connectors 38 which are electronic components mounted on the electronic board 16 are provided. When the base 28 is viewed from the side where the fins 30 are provided, the second inclined portion 36 has a lower end part 40 projecting downward substantially in the direction of gravity, at the outer end of the base 28. It is noted that, when the base 28 is viewed from the side where the fins 30 are provided, instead of forming the lower end part 40 so as to protrude downward in the direction of gravity, the lower end part 40 may be formed as a surface continuous to and flush with a surface of the second inclined portion 36 on the inner side of the base 28.

[Discharge Mechanism]

Figure 4:
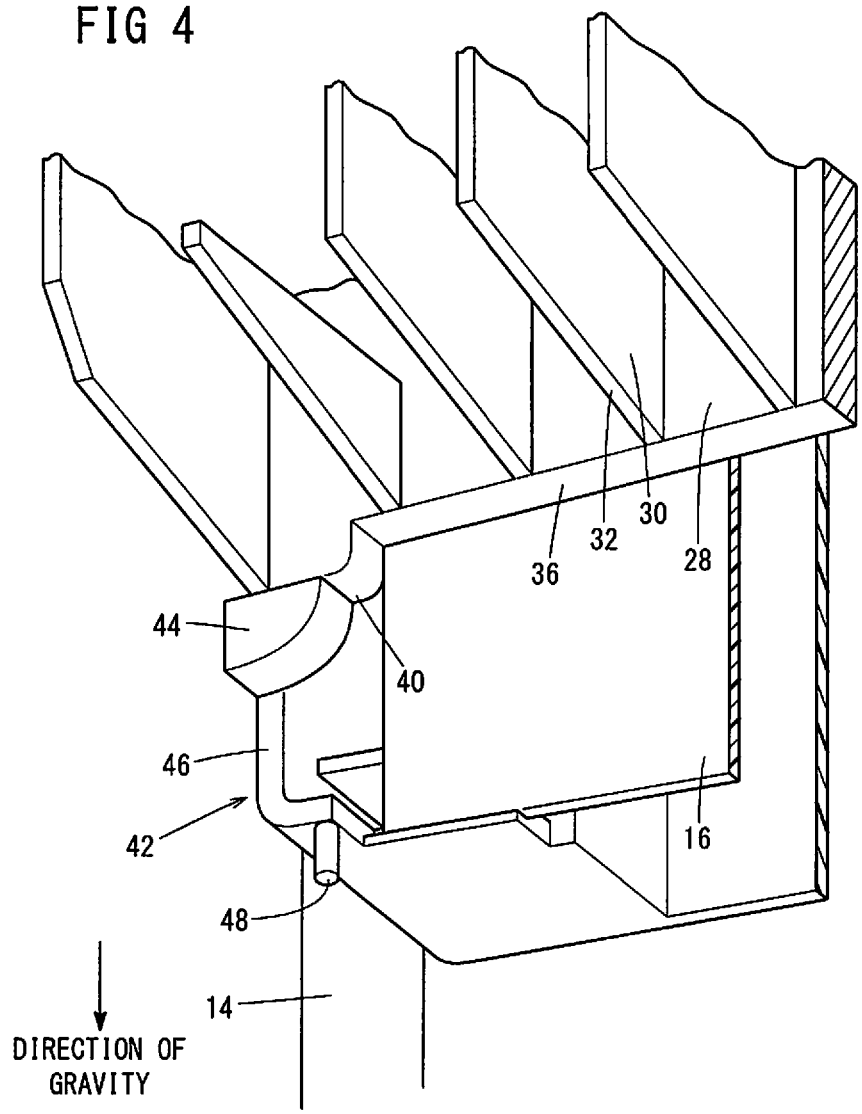
FIG. 4 is a partial perspective view showing the vicinity of a discharge mechanism of a housing.

FIG. 4 is a partial perspective view showing the vicinity of a discharge mechanism 42 in the housing 18. The discharge mechanism 42 has an abutment portion 44, a guide portion 46 and a projected portion 48.

The abutment portion 44 is formed on a lower side in the direction of gravity than the lower end part 40 formed on the base 28 of the heat sink 20. The abutment portion 44 abuts against a lower face of the lower end part 40 in the direction of gravity.

The guide portion 46 is provided on a lower side in the direction of gravity than the abutment portion 44, and formed continuously from the abutment portion 44. The guide portion 46 is formed so as to extend downward in the direction of gravity, and a vertically lower end part of the guide portion 46 is bent inward of the housing 18 when the housing 18 is viewed from the heat sink 20 side. The projected portion 48 is formed so as to protrude downward substantially in the direction of gravity from a lower surface of the guide portion 46. The projected portion 48 is formed in a cylindrical shape. It is noted that the direction in which the projected portion 48 extends may be inclined with respect to the direction of gravity. Further, the shape of the projected portion 48 is not limited to a cynical shape, but may be formed in a quadrangular prism shape.

[Flow of Cutting Fluid]

In machining an unillustrated workpiece by the apparatus 12, a cutting fluid may be used in some cases. The cutting fluid scatters around in mist form, and partly infiltrates into the interior of the apparatus 12. Since, in the vicinity of the heat sink 20, a large amount of air containing atomized cutting fluid flows, the cutting fluid is attached to the surfaces of the base 28 and the fins 30, and tends to be converted into liquid droplets.

The cutting fluid attaching to the surface of the base 28 is converted into liquid droplets, and moves along the surface of the base 28 to the lower surface of the base 28 in the direction of gravity. Further, the cutting fluid attaching to the surface of the fins 30 is converted into liquid droplets, and moves downward in the direction of gravity along the surface of the fins 30. The cutting fluid that has reached the lower surface of the fin 30 in the direction of gravity moves along the surface of the first inclined portion 32 to the lower surface of the base 28.

The cutting fluid that has reached the lower surface of the base 28 moves to the lower end part 40 along the surface of the second inclined portion 36. The cutting fluid that has reached the lower end part 40 moves down to the abutment portion 44 of the housing 18 and moves to the guide portion 46 along the surface of the abutment portion 44. The cutting fluid that has reached the guide portion 46 moves down to the projected portion 48 along the surface of the guide portion 46. When the cutting fluid accumulates at the tip of the projected portion 48 up to a certain level, then the cutting fluid falls down as liquid droplets from the tip of the projected portion 48 in the direction of gravity.

That is, the cutting fluid attaching to the fins 30 finally moves to the projected portion 48 and drips therefrom. As a result, it is possible to suppress dropping of cutting fluid to areas other than the vertically lower area of the projected portion 48, and also it is possible to cause the cutting fluid to drip into a specific location.

[Operation and Effect]

As described above, cutting fluid is prone to attach to the surfaces of the fins 30 of the heat sink 20. As the cutting fluid adhering to the fins 30 drips downwardly of the heat sink 20 in the direction of gravity, there is a risk that the cutting fluid attaches to the connectors 38 located on the lower side of the heat sink 20 in the direction of gravity. Further, when there are unillustrated electronic components inside the exterior cover 22 of the apparatus 12 and on the vertically lower side of the heat sink 20, there is a concern that the cutting fluid may attach to the electronic components. In order to prevent corrosion and short-circuit of the connectors 38 and the electronic components, it is necessary to suppress attaching of cutting fluid to the connectors 38 and electronic components.

Further, as described above, since the cooling unit of the present embodiment is of a fanless type, the heat sink 20 used herein is greater in size than a cooling unit having a fan. Therefore, since a space under the heat sink 20 in the direction of gravity is larger, it is hence difficult to arrange connectors 38, electronic components, and the like at a location other than the space under the heat sink 20.

To deal with this, in the present embodiment, each fin 30 has the first inclined portion 32 at the lower surface thereof in the direction of gravity, and the first inclined portion is inclined downward from the distal side of the fin 30 toward the base 28. Further, the base 28 has the second inclined portion 36 at the lower surface thereof in the direction of gravity, and the second inclined portion is inclined with respect to the horizontal direction when the base 28 is viewed from the side where the fins 30 are provided.

This configuration allows the cutting fluid attaching to the fins 30 to move along the first inclined portion 32 to the lower surface of the base 28, further move along the second inclined portion 36, and gather at the lower end part 40 of the second inclined portion 36. This configuration makes it possible for the cutting fluid to drip from the heat sink 20 to a specific location. Thus, by arranging the connectors 38 and the electronic components at positions other than the area under the specific location of the heat sink 20, it is possible to suppress attaching of cutting fluid to the connectors 38 and the electronic components.

Further, in the present embodiment, the lower end part 40 of the second inclined portion 36 in the direction of gravity is provided at each of the both horizontal ends when the base 28 is viewed from the side where the fins 30 are provided. Accordingly, when the electronic board 16 is viewed from the side where the heat sink 20 is provided, it is possible to arrange the connectors 38 and other electronic components together in the central area with respect to the horizontal direction, and hence realize increased flexibility in designing the electronic board 16.

Further, in the present embodiment, the housing 18 includes the discharge mechanism 42, which abuts against the lower end part 40 of the second inclined portion 36 in the direction of gravity and extends substantially vertically downward. The abutment portion 44 of the discharge mechanism 42 causes cutting fluid to move from the heat sink 20 to the housing 18, whereby the cutting fluid that has moved to the abutment portion 44 can move down along the guide portion 46.

The material of the heat sink 20 is aluminum or the like, and is formed by extrusion molding and cutting. On the other hand, the material of the housing 18 is resin or the like, and is formed by injection molding. Therefore, as compared with the heat sink 20, the housing 18 can be formed more easily into a complex shape. As a result, the cost for producing the structure for guiding cutting fluid to a specific position can be suppressed.

In the present embodiment, the discharge mechanism 42 of the housing 18 includes the projected portion 48 protruding substantially downward in the direction of gravity from the vertically lower end part of the guide portion 46. Thus, it is possible to collect cutting fluid at the tip of the projected portion 48 which has a relatively narrow area, and make it easier for the cutting fluid to drip against the surface tension with the projected portion 48.

Second Embodiment

The second embodiment includes a discharge mechanism 42 that is partly different in structure from the first embodiment. Regarding the other components, the second embodiment has the same configurations as the first embodiment does.

[Discharge Mechanism of Cutting Fluid]

Figure 5:
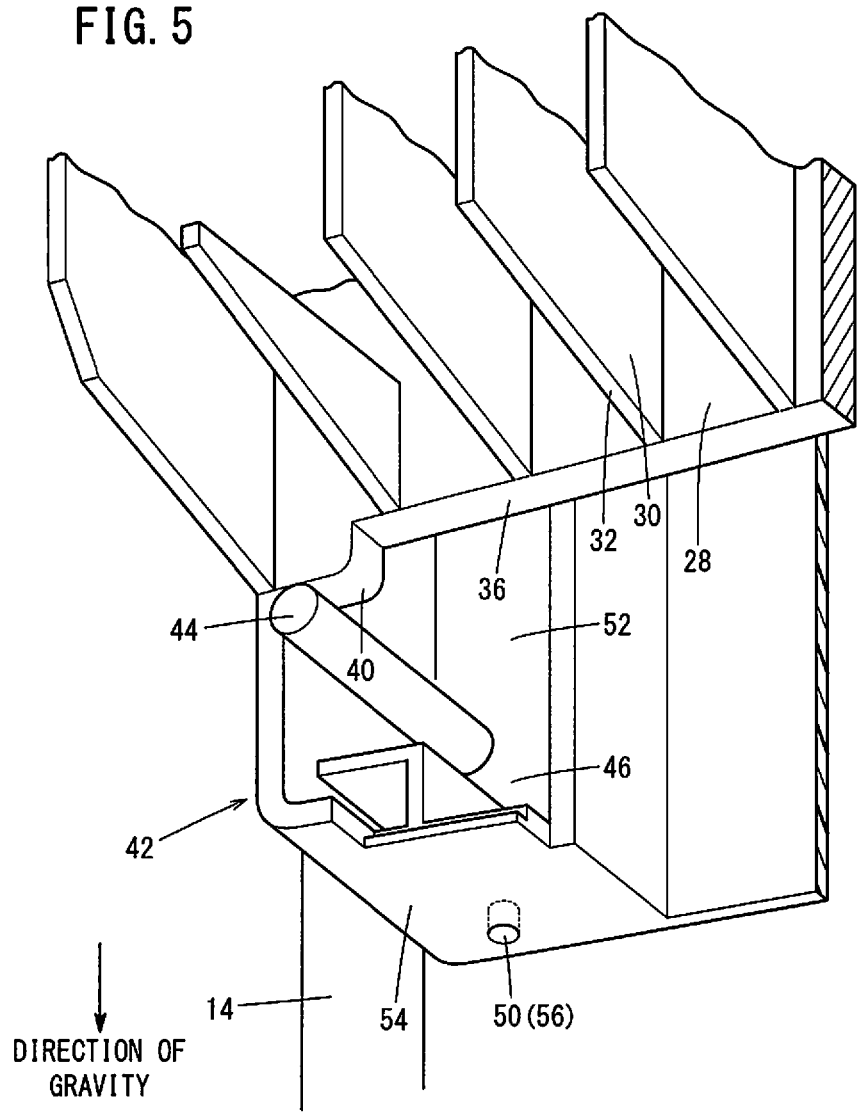
FIG. 5 is a partial perspective view showing the vicinity of a discharge mechanism of a housing.

FIG. 5 is a partial perspective view showing the vicinity of a discharge mechanism 42 of a housing 18. In FIG. 5, in order to make the structure of the discharge mechanism 42 visible, the electronic board 16 is not illustrated. The discharge mechanism 42 has an abutment portion 44, a guide portion 46, and a discharge hole 50.

The abutment portion 44 is formed on a lower side in the direction of gravity than the lower end part 40 formed on the base 28 of the heat sink 20. The abutment portion 44 protrudes on a bottom portion 52 of the housing 18 that is located on the touch panel display 14 side, more specifically, from a surface of the bottom portion 52 on the heat sink 20 side. The abutment portion 44 is formed in a cylindrical shape. The tip of the abutment portion 44 on the heat sink 20 side is in contact with or abutment against the lower surface of the lower end part 40 in the direction of gravity.

The guide portion 46 is configured as a part of the bottom portion 52 of the housing 18, and formed on a lower side in the direction of gravity than the proximal portion of the abutment portion 44. The guide portion 46 is formed continuously with the abutment portion 44, and extends downward in the direction of gravity. The discharge hole 50 is formed in a wall portion 54 that is formed so as to extend away from a vertically lower portion of the guide portion 46. The discharge hole 50 is a hole penetrating the wall portion 54 substantially in the direction of gravity, to be open downward substantially in the direction of gravity. The discharge hole 50 constitutes an opening hole 56. The discharge hole 50 may be formed as a passage hole inclined with respect to the direction of gravity. Further, the orientation of the opening of the discharge hole 50 may be formed obliquely with respect to the direction of gravity.

[Flow of Cutting Fluid]

The cutting fluid that has reached the lower end part 40 of the base 28 moves to the abutment portion 44 of the housing 18 and further moves to the guide portion 46 along the surface of the abutment portion 44. The cutting fluid that has reached the guide portion 46 moves to the wall portion 54 along the surface of the guide portion 46. When a certain amount of cutting fluid accumulates on the wall portion 54 of the housing 18, the cutting fluid drips downward in the direction of gravity from the discharge hole 50.

That is, the cutting fluid attaching to the fins 30 finally moves to the discharge hole 50 and drips therefrom. As a result, it is possible to prevent cutting fluid from dripping to the areas other than the area under the discharge hole 50 in the direction of gravity, and it is possible for the cutting fluid to drip on a specific location.

[Operation and Effect]

In the present embodiment, the housing 18 has the discharge hole 50 that is formed at the lower end part of the discharge mechanism in the direction of gravity so as to open downward in the direction of gravity. The location on which the cutting fluid drips can be limited only to the area under the discharge hole 50. By arranging the connectors 38 and the electronic components in the areas other this location, attaching of cutting fluid to the connectors 38 and the electronic components can be prevented.

Modification 1

The display units 10 according to the first and second embodiments use a fanless cooling unit. Even if a fan-equipped cooling unit is adopted, there is a risk that cutting fluid may attach to the fins of the heat sink. Therefore, the same configurations as in the first and second embodiments may be applied to display units using fan-equipped cooling units. With this configuration, the positions on which cutting fluid drips from the heat sink can be limited to a specific location, and by arranging the electronic components and the like on areas other than the specific location on a lower side of the heat sink in the direction of gravity, it is possible to prevent attaching of cutting fluid to the electronic components and the like.

Modification 2

In the display unit 10 according to the first embodiment, the projected portion 48 is formed so as to protrude downward in the direction of gravity from the lower surface of the guide portion 46. In Modification 2, the projected portion 48 may be formed so as to protrude from the side surface of the guide portion 46 in a transverse direction with respect to the direction of gravity.

Modification 3

In the display unit 10 according to the second embodiment, the discharge hole 50 is a hole penetrating the wall portion 54 substantially in the direction of gravity, and is formed to open downward substantially in the direction of gravity. In Modification 3, the discharge hole 50 may be formed as a hole penetrating a side wall portion of the guide portion 46 in a direction transverse to the direction of gravity, the side wall portion being formed so as to extend away from the guide portion 46.

Technical Concepts Obtained from Embodiment

Technical concepts that can be grasped from the above embodiments will be described below.

In the electronic device (26) having the heat sink (20), the heat sink (20) includes the flat-plate-shaped base (28) and fins (30) protruding from one surface of the base (28) and extending substantially in the direction of gravity in a state where the electronic device (26) is mounted on the apparatus (12). Each of the fins (30) has the first inclined portion (32) on the lower surface thereof in the direction of gravity, the first inclined portion being configured to incline downward in the direction of gravity toward the base (28). The base (28) has the second inclined portion (36) on the lower surface thereof in the direction of gravity, the second inclined portion being configured to incline with respect to the horizontal direction when the base (28) is viewed from a side where the fins (30) are provided. With the above configuration, it is possible to drop the cutting fluid from the heat sink (20) on a specific location.

In the above electronic device (26), the lower end part (40) of the second inclined portion (36) in the direction of gravity may be arranged at each of both ends of the base (28) in the horizontal direction, when the base (28) is viewed from the side where the fins (30) are provided. With this configuration, it is possible to arrange the connectors (38) and other electronic components together on the horizontal center area when the electronic board (16) is viewed from a side where the heat sink (20) is provided. As a result, it is possible to realize increased flexibility in designing the electronic board (16).

In the above electronic device (26), the housing (18) of the electronic device (26) may include the discharge mechanism (42) which is configured to abut against the lower end part (40) of the second inclined portion (36) in the direction of gravity and extend substantially downward in the direction of gravity. Owing thereto, it is possible to suppress the cost of producing the structure for guiding the cutting fluid to a specific location.

In the above electronic device (26), the discharge mechanism (42) may include a projected portion (48) protruding substantially downward in the direction of gravity from the lower end part of the discharge mechanism (42) in the direction of gravity. Thus, it is possible to collect cutting fluid at the tip of the projected portion (48) which has a relatively narrow area, and thereby make it easier for the cutting liquid to drip against the surface tension with the projected portion (48).

In the above electronic device (26), the discharge mechanism (42) may have an opening hole (56) that is formed at the lower end part of the discharge mechanism (42) in the direction of gravity so as to open substantially downward in the direction of gravity. With this configuration, it is possible to drop the cutting fluid only on the area under the discharge hole (50) in the direction of gravity. Thus, by arranging the electronic components on the areas other than the area under the discharge hole, attaching of cutting fluid to the electronic components is prevented.

The present invention is not particularly limited to the embodiments described above, and various modifications are possible without departing from the essence and gist of the present invention.

What is claimed is:

1. An electronic device having a heat sink, wherein:
the heat sink includes:
a flat-plate-shaped base; and
fins protruding from one surface of the base and extending substantially in a direction of gravity in a state where the electronic device is mounted on an apparatus;
a first inclined portion defined on a lower surface of each of the fins in the direction of gravity, the first inclined portion being configured to incline downward in the direction of gravity toward the base; and
a second inclined portion defined on a lower surface of the base in the direction of gravity, the second inclined portion being configured to incline with respect to a horizontal direction when the base is viewed from a side where the fins are provided, wherein the second inclined portion includes two inclined portions formed on either side of a central portion of the base.

2. The electronic device according to claim 1, wherein a lower end part of the second inclined portion in the direction of gravity is arranged at each of both ends of the base in the horizontal direction, when the base is viewed from the side where the fins are provided.

3. The electronic device according to claim 1, wherein a housing of the electronic device includes a discharge mechanism which is configured to abut against a lower end part of the second inclined portion in the direction of gravity and extend substantially downward in the direction of gravity.

4. The electronic device according to claim 3, wherein the discharge mechanism includes a projected portion protruding substantially downward in the direction of gravity from a lower end part of the discharge mechanism in the direction of gravity.

5. The electronic device according to claim 3, wherein the discharge mechanism has an opening hole that is formed at a lower end part of the discharge mechanism in the direction of gravity so as to open substantially downward in the direction of gravity.

* * * * *